(12) United States Patent
Matsubara

(10) Patent No.: US 8,669,549 B2
(45) Date of Patent: Mar. 11, 2014

(54) METHOD OF MANUFACTURING LAMINATED BODY AND LAMINATED BODY

(71) Applicant: Toppan Printing Co., Ltd., Tokyo (JP)

(72) Inventor: Ryohei Matsubara, Tokyo (JP)

(73) Assignee: Toppan Printing Co., Ltd. (JP)

( * ) Notice: Subject to any disclaimer, the term of this patent is extended or adjusted under 35 U.S.C. 154(b) by 0 days.

(21) Appl. No.: 13/629,133

(22) Filed: Sep. 27, 2012

(65) Prior Publication Data
US 2013/0048972 A1 Feb. 28, 2013

Related U.S. Application Data

(63) Continuation of application No. PCT/JP2011/054640, filed on Mar. 1, 2011.

(30) Foreign Application Priority Data

Mar. 30, 2010 (JP) .................................. 2010-077098

(51) Int. Cl.
H01L 35/24 (2006.01)
(52) U.S. Cl.
USPC .................................... 257/40; 257/E51.001
(58) Field of Classification Search
USPC .......................................... 257/40, E51.001
See application file for complete search history.

(56) References Cited

U.S. PATENT DOCUMENTS

2005/0139823 A1* 6/2005 Hirakata et al. ................ 257/40

FOREIGN PATENT DOCUMENTS

| JP | 01-101668 | 4/1989 |
| JP | 03-291971 | 12/1991 |
| JP | 2004-297011 | 10/2004 |
| JP | 2005-210086 | 8/2005 |
| JP | 2007-266355 | 10/2007 |

OTHER PUBLICATIONS

Translation of the International Preliminary Report on Patentability for PCT/JP2011/054640, mailed Nov. 22, 2012, 9 pgs.

* cited by examiner

Primary Examiner — Anthony Ho
(74) Attorney, Agent, or Firm — Squire Sanders (US) LLP

(57) ABSTRACT

A laminated body includes a lower electrode formed on a substrate and a basic insulating film which is formed above the lower electrode and covers the lower electrode on the substrate, in which the lower electrode has a film thickness reduction section in which the film thickness of the lower electrode in a portion which is not covered by the basic insulating film is smaller than the film thickness of the lower electrode in a portion which is covered by the basic insulating film in the lower electrode.

5 Claims, 14 Drawing Sheets

METHOD OF MANUFACTURING LAMINATED BODY AND LAMINATED BODY

CROSS-REFERENCE TO RELATED APPLICATION

This application is a continuation of International Application No. PCT/JP2011/054640, filed Mar. 1, 2011, which is incorporated herein by reference.

BACKGROUND OF THE INVENTION

1. Field of the Invention

The present invention relates to a method of manufacturing a laminated body and a laminated body which has electrodes on both surfaces of an insulating film, for example.

2. Background Art

Due to outstanding progress in information technology, information is at present frequently transmitted and received using a notebook-type personal computer, a mobile information terminal, or the like. Accordingly, it is a well-known fact that a ubiquitous society in which the information can be transmitted and received at any place is approaching in the near future. In the ubiquitous society, there is a demand for a lighter and thinner information terminal.

At present, a mainstream of a semiconductor material is a silicon type, and as a method of manufacturing thereof, a photolithography method is generally used.

On the other hand, attention has been paid to printable electronics in which an electronic member is manufactured using printing technology. There are merits that the printable electronics reduce costs relating to an apparatus and manufacturing more than the photolithography method by using printing technology, and since there is no requirement for a vacuum or high temperature, a plastic substrate can be used.

In printable electronics, as a semiconductor material, an organic semiconductor which is soluble in an organic solvent or the like is generally used. This is because a semiconductor layer can be formed by a printing method.

As a method of using an organic semiconductor which is soluble in an organic solvent or the like as a semiconductor material, for example, there is a technology disclosed in JP-A-2005-210086. In JP-A-2005-210086, an organic semiconductor layer is formed by an ink jet method. Here, a TFT using an organic semiconductor is referred to as an organic TFT.

As members configuring a TFT, there are an electrode and an insulating film other than a semiconductor. However, there is a demand for an electrode and an insulating film to be formed using a wet method such as a printing method and a coating technology to form a TFT with low costs.

As a technology that forms an electrode and an insulating film using a wet method, for example, there are technologies disclosed in JP-A-2004-297011 and JP-A-2007-266355. In JP-A-2004-297011, an electrode is formed by an ink jet method and in JP-A-2007-266355, a gate insulating film is formed by a spin coat method.

Here, for example, when a display or the like is driven by using an organic TFT, the gate insulating film is usually formed to have a thickness of 1.0 μm or less in order to obtain a driving voltage and a desired current value.

However, tiny protrusions are locally formed in the electrodes formed by the technologies as described in JP-A-2004-297011 and JP-A-2007-266355 in some cases. Moreover, a locally thick film portion caused by cohesion of ink and foreign substances originating from the environment and processes are often present in the electrode formed by a wet method other than protrusions.

In this case, when the gate insulating film is formed by the wet method, a difference in wettability is generated with respect to other portions due to foreign substances present in the electrode in a part of the gate insulating film and there is a possibility of forming a portion which is not covered by the gate insulating film in the electrode (hereafter, referred to as "lower electrode").

In the wet method such as a spin coat method, since the shape followability to an underlying layer becomes worse in comparison with a dry method such as a sputtering method, and when protruding objects or foreign substances are present in the lower electrode, there is a possibility of forming a portion which is not covered by the gate insulating film in the lower electrode.

Then, in a state in which the portion which is not covered by the gate insulating film in the lower electrode is formed and in a state in which an electrode (hereafter, referred to as "upper electrode") is laminated on the gate insulating film, since the lower electrode comes into contact with or comes close to the upper electrode, there is a possibility that a short circuit and a leakage can be generated between the lower electrode and the upper electrode.

Therefore, when the electrode or the gate insulating film is formed by the wet method, there is a possibility that a short circuit and a leakage can be generated between the lower electrode and the upper electrode in a state in which the upper electrode is laminated on the gate insulating film.

SUMMARY OF THE INVENTION

An object of the invention is to provide a method of manufacturing a laminated body and a laminated body capable of suppressing a short circuit and a leakage which are generated between a lower electrode and an upper electrode when an electrode or a gate insulating film is formed by a wet method.

A first aspect of the present invention is a method of manufacturing a laminated body which forms a basic insulating film that covers a lower electrode formed on a substrate, the method including:

forming a film thickness reduction section in which a film thickness of a portion of the lower electrode not covered by the basic insulating film is less than a film thickness of a portion of the lower electrode covered by the basic insulating film.

A seventh aspect of the present invention is a laminated body comprising:

a lower electrode formed on a substrate; and a basic insulating film which is formed on and covers the lower electrode, wherein the lower electrode has a film thickness reduction section in which a film thickness of a portion of the lower electrode not covered by the basic insulating film is less than a film thickness of a portion of the lower electrode covered by the basic insulating film.

According to the invention, it is possible to remove protrusions formed in a lower electrode and foreign substances on the lower electrode when a film thickness reduction section is formed on the lower electrode, and to cover pin holes formed on a basic insulating film by an insulating film which is formed on the basic insulating film and is disposed between the lower electrode and an upper electrode.

Therefore, the contact between the lower electrode and the upper electrode can be prevented and a short circuit and a leakage generated between the lower electrode and the upper electrode can be suppressed such that a method of manufacturing a laminated body and a laminated body can be provided.

According to the first aspect of the invention, a film thickness reduction section formed with fine pores is formed in a lower electrode so that protrusions formed in the lower electrode and foreign substances on the lower electrode can be removed.

For this reason, the film thickness reduction section is allowed to form a gap between the lower electrode and an upper electrode such that it is possible to suppress the lower electrode from coming into contact with or close to the upper electrode and to suppress a short circuit and a leakage generated between the lower electrode and the upper electrode.

According to the second aspect of the invention, the film thickness reduction section is formed by etching so that the film thickness reduction section can be easily formed in the lower electrode.

According to the third aspect of the invention, after forming at least a part of a basic insulating film, the basic insulating film is subjected to etching as a mask so that protrusions formed in the lower electrode and foreign substances on the lower electrode can be selectively etched.

According to the fourth aspect of the invention, at least one of the lower electrode and the basic insulating film is formed by a wet method so that it is possible to reduce the costs of the laminated body.

According to the fifth aspect of the invention, since it is possible to suppress the lower electrode from coming into contact with the upper electrode by a laminated insulating film formed on the basic insulating film, the laminated body capable of suppressing a short circuit and a leakage generated between the lower electrode and the upper electrode can be formed.

According to the sixth aspect of the invention, at least one of the laminated insulating film and the upper electrode is formed by the wet method so that it is possible to reduce the costs of the laminated body.

According to the seventh aspect of the invention, since a lower electrode has a film thickness reduction section formed with fine pores, a laminated body can adopt a configuration in which protrusions formed in the lower electrode and foreign substances on the lower electrode are removed.

Therefore, it is possible to suppress the lower electrode from coming into contact with or close to an upper electrode and to suppress a short circuit and a leakage generated between the lower electrode and the upper electrode.

According to the eighth aspect of the invention, a basic insulating film and a laminated insulating film are laminated so that the basic insulating film can be used as a mask at the time of etching the lower electrode and insulation properties of the laminated insulating film can be improved.

According to the ninth aspect of the invention, since the basic insulating film and the laminated insulating film are made of the same material, the film thickness reduction section is formed in the lower electrode by etching the basic insulating film as a mask and then, the laminated insulating film can be effectively formed in the film thickness reduction section at the time of laminating the laminated insulating film.

According to the tenth aspect of the invention, the contact between the lower electrode and the upper electrode can be suppressed by the laminated insulating film formed on the basic insulating film and the laminated body in which a short circuit and a leakage generated between the lower electrode and the upper electrode can be suppressed can be formed.

According to the eleventh aspect of the invention, the lower electrode is made of metal or metal oxide so that the film thickness reduction section can be easily formed in the lower electrode by a known etching method.

According to the twelfth aspect of the invention, the laminated body is used in a thin film transistor so that the thin film transistor in which a short circuit and a leakage generated between the lower electrode and the upper electrode are suppressed and which has high reliability can be obtained.

According to the thirteenth aspect of the invention, since a semiconductor layer is formed with an organic semiconductor, the configuration member of the thin film transistor can be formed by a printing method so that the costs of the thin film transistor can be reduced.

According to the fourteenth aspect of the invention, since the laminated body is used in a capacitor, the capacitor in which a short circuit and a leakage generated between the lower electrode and the upper electrode are suppressed and which has high reliability can be obtained.

According to the fifteenth aspect of the invention, since the laminated body is used in an intersection section between lines, the intersection section between lines in which a short circuit and a leakage generated between the lower electrode and the upper electrode are suppressed and which has high reliability can be obtained.

According to the sixteenth aspect of the invention, since a substrate has flexibility, it is possible for the laminated body to have a flexible configuration.

Furthermore, in the substrate having flexibility, since the roughness of the surface due to protruding objects or the like is generally increased in comparison with the case where the substrate is made of a hard material such as glass, even in the case where the lower electrode is formed, the lower electrode comes into contact with or comes close to the upper electrode by unevenness due to the roughness of the surface and there is a possibility that a short circuit and a leakage can be increased between the lower electrode and the upper electrode.

However, according to the invention, since protrusions of the lower electrode caused by the protruding objects of the substrate having flexibility can be set as the film thickness reduction section by etching, the contact between the lower electrode and the upper electrode can be suppressed by the film thickness reduction section and the effect of suppressing a short circuit and a leakage generated between the lower electrode and the upper electrode can be increased.

According to the seventeenth aspect of the invention, since the substrate having flexibility is made of plastic, it is possible to obtain the laminated body having flexibility with low costs.

BRIEF DESCRIPTION OF THE DRAWINGS

FIG. 12A is a view showing only the laminated body, and FIG. 12B is a view showing the entire thin film transistor array.

DETAILED DESCRIPTION OF THE INVENTION

First Embodiment

Hereafter, a first embodiment of the invention (referred to as "the embodiment" below) will be described with reference to drawings.
Configuration First, a configuration of a laminated body 1 according to the embodiment will be described using FIGS. 1 and 2.

Figure 1:
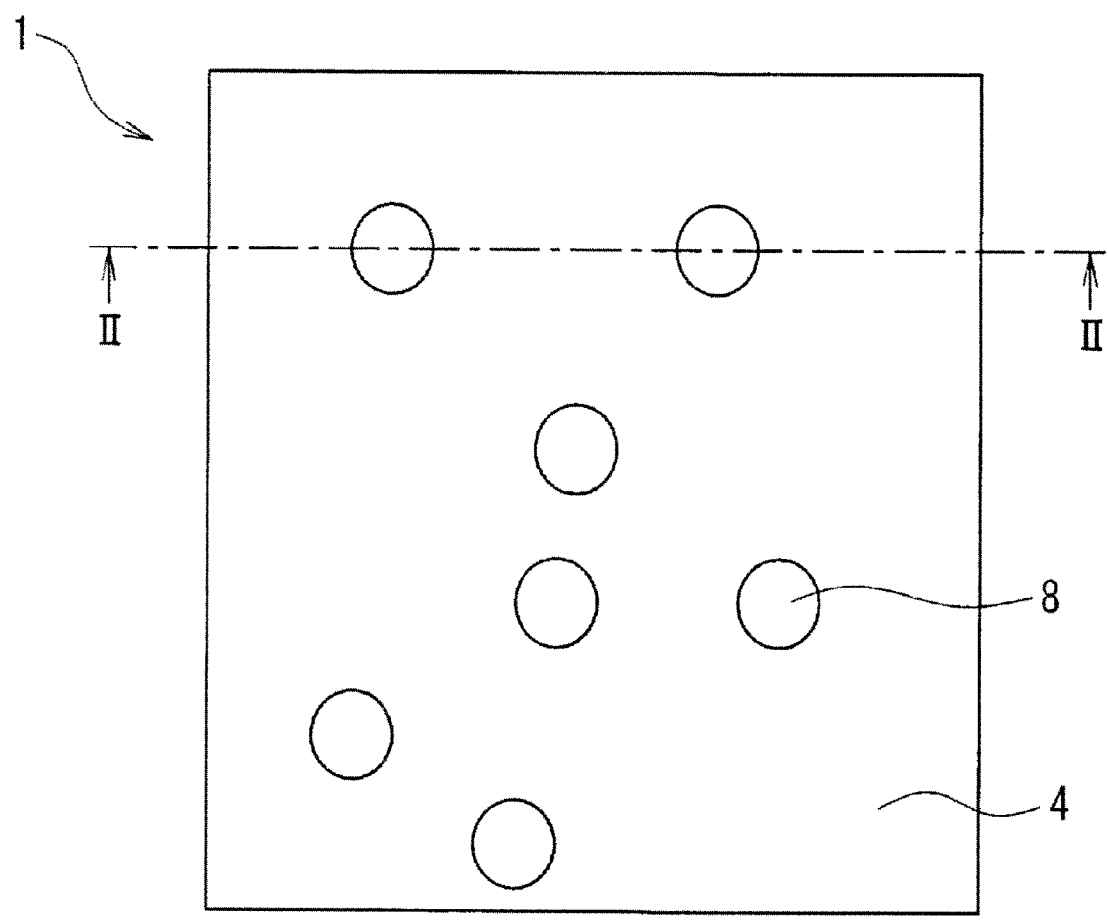
FIG. 1 is a view showing a schematic configuration of a laminated body according to a first embodiment of the invention.
Figure 2:
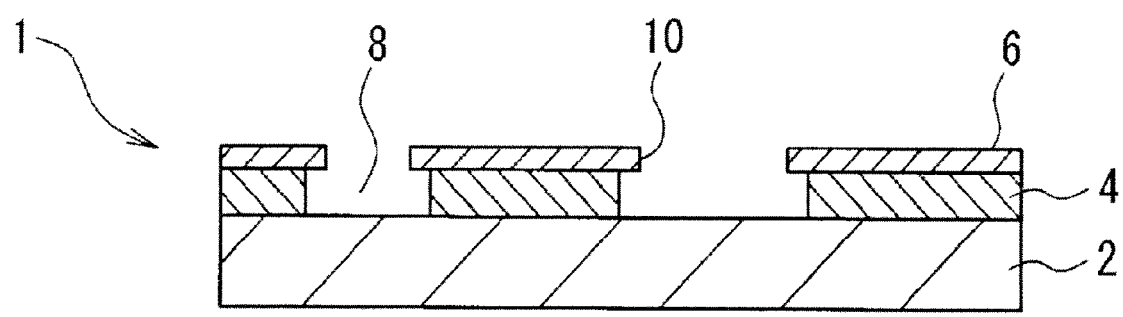
FIG. 2 is a cross-sectional view taken along a line II-II in FIG. 1.
Figure 3:
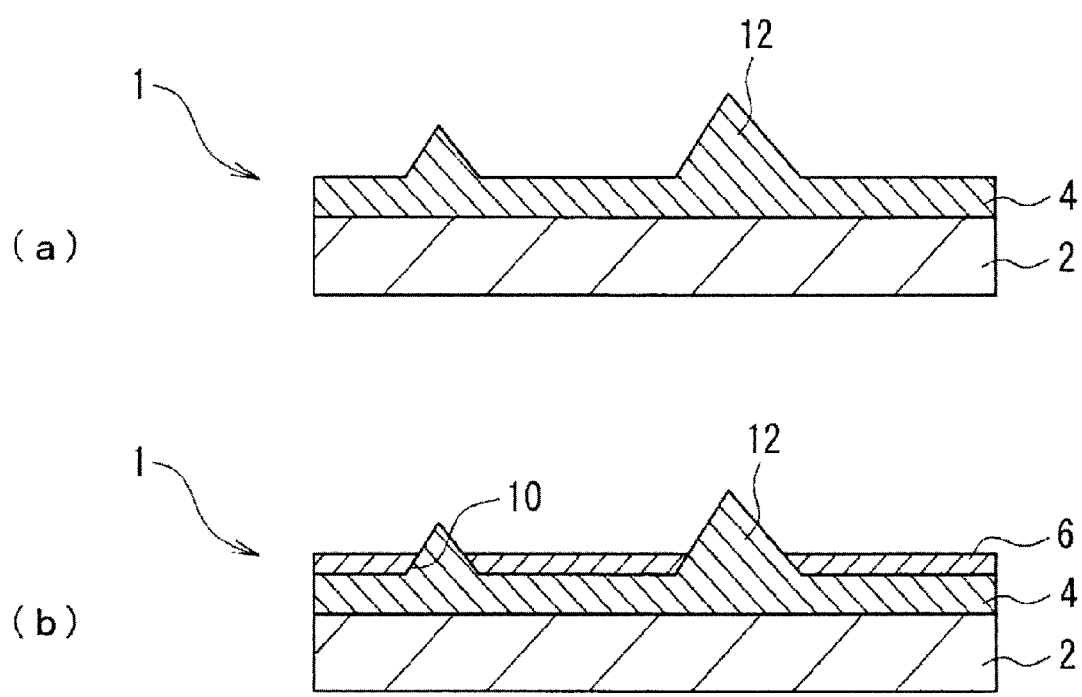
FIGS. 3A and 3B are conceptual views showing a process of forming a film thickness reduction section and a basic insulating film according to the first embodiment of the invention.
Figure 4:
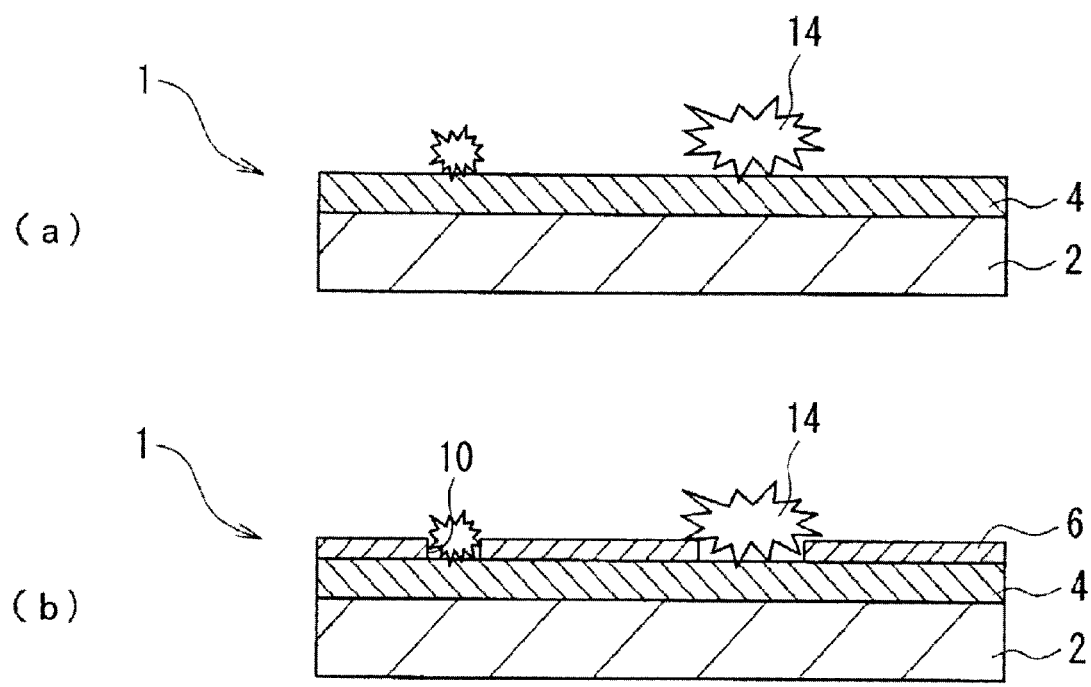
FIGS. 4A and 4B are conceptual views showing a process of forming the film thickness reduction section and the basic insulating film according to the first embodiment of the invention.

FIG. 1 is a view showing a schematic configuration of the laminated body 1 according to the embodiment. FIG. 2 is a cross-sectional view taken along a line II-II in FIG. 1.

The laminated body 1 of the embodiment includes a substrate 2, a lower electrode 4 and a basic insulating film 6, as shown in FIGS. 1 and 2.

The substrate 2 is a plate-like member made of plastic as a material and has flexibility.

The lower electrode 4 made of metal or metal oxide is formed on the substrate 2 and has a film thickness reduction section 8. The film thickness reduction section 8 will be described later.

Here, the reason the lower electrode 4 is made of metal or metal oxide is that the film thickness reduction section 8 is easily formed in the lower electrode 4 by etching described later.

Moreover, specific examples of metals and metal oxides include gold, silver, aluminum, copper, platinum, nickel, chromium, and an indium tin oxide.

When the lower electrode 4 is formed by a wet method, a solution in which particles made of silver, gold and palladium are dispersed is used as the material of the lower electrode 4.

The basic insulating film 6 is formed on the lower electrode 4 and covers the lower electrode 4.

The material for forming the basic insulating film 6 is not particularly limited; however, when the lower electrode 4 is subjected to etching and the film thickness reduction section 8 is provided, it is preferable to use a material with resistance.

Therefore, specific examples of the materials for forming the basic insulating film 6 include polymer solutions generally used such as a polyvinyl phenol, a polymethylmethacrylate, a polyimide, a polyvinyl alcohol, and an epoxy resin; and solutions in which particles such as aluminas and silica gels are dispersed.

Furthermore, specific examples of the materials for forming the basic insulating film 6 include inorganic materials such as a silicon oxide, a silicon nitride, a silicon oxynitride, an aluminum oxide, a tantalum oxide, a yttrium oxide, a hafnium oxide, a hafnium aluminate, a zirconia oxide, and a titanium oxide.

Thin films made of PET, PEN, PES or the like can be used as the basic insulating film 6 in addition to forming the basic insulating film 6 using above-described materials.

A method of forming the basic insulating film 6 is not particularly limited and dry methods such as a vacuum evaporation method, a sputtering method, and CVD, a wet method such as spin coating and slit die coating, and methods such as laminating can appropriately be used.

The film thickness reduction section 8 is formed in a portion which is not covered by the basic insulating film 6 in the lower electrode 4. A method of forming the film thickness reduction section 8 in the lower electrode 4 will be described later.

The film thickness reduction section 8 is, for example, a concave section which is opened to a through hole which passes through the lower electrode 4 in a thickness direction (a vertical direction in FIG. 2) or a surface facing the basic insulating film 6 of the lower electrode 4 (an upper surface in FIG. 2). FIG. 2 shows a state in which the film thickness reduction section 8 is a through hole.

In other words, the film thickness reduction section 8 is formed such that the film thickness of the lower electrode 4 in the portion which is not covered by the basic insulating film 6 is smaller than the film thickness of the lower electrode 4 in a portion which is covered by the basic insulating film 6 in the lower electrode 4.

Furthermore, when the film thickness reduction section 8 is the concave section, in comparison with the case where the film thickness reduction section 8 is the through hole, the film thickness reduction section 8 has little influence on charge held in a thin film transistor or a capacitor having the laminated body 1 and a voltage applied to a transistor section or the like.

The size of the film thickness reduction section 8 (opening area) is not particularly limited and it is preferable that the size be as small as possible, for example, a thickness of about 50 nm to 5 μm. This is because the size of the film thickness reduction section 8 has influence on charge held in a thin film transistor or a capacitor having the laminated body 1, a voltage applied to a transistor section or the like.

Moreover, in the basic insulating film 6, pin holes 10 which pass through the basic insulating film 6 in the thickness direction are opened above the film thickness reduction section 8. The pin holes 10 are generated when the basic insulating film 6 is formed due to protrusions or foreign substances in the lower electrode 4.
Method of Manufacturing Laminated Body Hereafter, the method of manufacturing the laminated body 1 according to the embodiment will be described using FIGS. 3A to 4B with reference to FIGS. 1 and 2.

FIGS. 3A to 4B are conceptual views showing a process of forming the film thickness reduction section 8 and the basic insulating film 6 according to the embodiment.

The method of manufacturing the laminated body according to the embodiment includes forming a film thickness reduction section 8 in which the film thickness of the lower electrode 4 in the portion which is not covered by the basic insulating film 6 in the lower electrode 4 is smaller than the film thickness of the lower electrode 4 in the portion which is covered by the basic insulating film 6.

In the method of manufacturing the laminated body according to the embodiment, the case where the lower electrode 4 and the basic insulating film 6 are formed by the wet method is described.

Here, the portion which is not covered by the basic insulating film 6 in the lower electrode 4 is generated in the case where, for example, as shown in FIG. 3A, protrusions 12 more protruding than other portions are formed in the lower electrode 4 formed on the substrate 2.

Other than the above case, the portion which is not covered by the basic insulating film 6 in the lower electrode 4 is generated in the case where, for example, as shown in FIG. 4A, foreign substances 14 such as tiny dust particles are present on the lower electrode 4 formed on the substrate 2.

In a state where the protrusions 12 are formed in the lower electrode 4 formed on the substrate 2, when the basic insulating film 6 is formed on the lower electrode 4, for example, as shown in FIG. 3B, the basic insulating film 6 is not formed in a portion in which the protrusion 12 is formed in the lower electrode 4. Therefore, the portion in which the protrusion 12 is formed in the lower electrode 4 is the portion which is not covered by the basic insulating film 6.

Moreover, in the portion in which the protrusion 12 is formed in the lower electrode 4, the formation of the basic insulating film 6 is inhibited by the protrusion 12. For this reason, the pin holes 10 are formed in a portion in which the lower electrode 4 is not covered in the basic insulating film 6. In particular, when the basic insulating film 6 is formed by the wet method as the embodiment, there is a possibility that the protrusion 12 is not covered by the basic insulating film 6 and the pin holes 10 are formed by a leveling action.

In addition, in a state where foreign substances 14 are present on the lower electrode 4 formed on the substrate 2, when the basic insulating film 6 is formed on the lower electrode 4, for example, as shown in FIG. 4B, in a portion in which the foreign substances 14 are present in the lower electrode 4, the basic insulating film 6 is not formed. Therefore, the portion in which the foreign substances 14 are present in the lower electrode 4 is the portion which is not covered by the basic insulating film 6.

Furthermore, the formation of the basic insulating film 6 is inhibited by the foreign substances 14 in the portion in which the foreign substances 14 are present in the lower electrode 4. Due to this, the pin holes 10 are formed in the portion in which the lower electrode 4 is not covered in the basic insulating film 6.

As shown in FIGS. 3B and 4B, in a state in which the pin holes 10 are formed on the basic insulating film 6 and the portion which is not covered by the basic insulating film 6 in the lower electrode 4 is formed, when the upper electrode (not shown) is formed on the basic insulating film 6, since the lower electrode 4 comes into contact with or comes close to the upper electrode, there is a possibility that a short circuit and a leakage can be generated between the lower electrode 4 and the upper electrode.

Accordingly, in the method of manufacturing a laminated body 1 according to the embodiment, after the basic insulating film 6 is formed, the basic insulating film 6 is subjected to etching as a mask so that the protrusions 12 (refer to FIGS. 3A and 3B) and the foreign substances 14 (refer to FIGS. 4A and 4B) are removed and the film thickness reduction section 8 is formed in the lower electrode 4 (refer to FIG. 2) in forming a film thickness reduction section. At this time, the pin holes 10 are opened above the film thickness reduction section 8 (refer to FIG. 2) in the basic insulating film 6 with removal of the protrusions 12 and the foreign substances 14.

Here, as a method of forming the film thickness reduction section 8 in the lower electrode 4, it is suitable to use, for example, a wet etching method or a dry etching method. In the embodiment, as an example, the case where a method of forming the film thickness reduction section 8 in the lower electrode 4 is the wet etching method will be described.

Furthermore, in the embodiment, the case where the film thickness reduction section 8 is formed by etching the basic insulating film 6 as a mask, in a state where the entire basic insulating film 6 is formed, in the forming of the film thickness reduction section will be described.

When the method of forming the film thickness reduction section 8 in the lower electrode 4 is the wet etching method, microscopically, the etching proceeds not only in the film thickness direction of the lower electrode 4, but also in a direction parallel to a surface of the substrate 2 (side etching). For this reason, when the method of forming the film thickness reduction section 8 in the lower electrode 4 is the wet etching method, as shown in FIG. 2, as seen from the side, the film thickness reduction section 8 is larger than the pin holes 10 opened to the basic insulating film 6 which is a mask in some cases.

As described above, when the protrusions 12 and the foreign substances 14 are removed and the film thickness reduction section 8 is formed in the lower electrode 4 by etching the basic insulating film 6 as a mask, a possibility that a short circuit and a leakage can be generated between the lower electrode 4 and the upper electrode can be suppressed in comparison with the case where the upper electrode is formed on the basic insulating film 6 in a state in which the film thickness reduction section 8 is not formed in the lower electrode 4.

The reason for this will be described below.

When the upper electrode is formed on the basic insulating film 6, firstly, a laminated insulating film is formed on the basic insulating film 6, and then, the upper electrode is formed on the laminated insulating film.

Here, in the laminated body 1 manufactured in the method of manufacturing a laminated body 1 according to the embodiment, the film thickness reduction section 8 is formed in the lower electrode 4 and the protrusions 12 and the foreign substances 14 are removed. Therefore, the laminated insulating film formed on the basic insulating film 6 covers the basic insulating film 6 and the film thickness reduction section 8 and covers the pin holes 10 opened to the basic insulating film 6.

Accordingly, in the method of manufacturing a laminated body 1 according to the embodiment, the pin holes 10 are not formed on an insulating film configured by the basic insulating film 6 and the laminated insulating film and the upper electrode can be formed on the insulating film in a state where a portion which is not covered by the insulating film (the basic insulating film 6 and the laminated insulating film) is not present in the lower electrode 4.

Therefore, it is possible to suppress the lower electrode 4 from coming into contact with or close to the upper electrode and to suppress a short circuit and a leakage generated between the lower electrode 4 and the upper electrode.

Effects of First Embodiment

The effects of the first embodiment will be enumerated below.

(1) In the laminated body 1 according to the embodiment, the lower electrode 4 has the film thickness reduction section 8 in which the film thickness of the lower electrode 4 in the portion which is not covered by the basic insulating film 6 in the lower electrode 4 is smaller than the film thickness of the lower electrode 4 in the portion which is covered by the basic insulating film 6.

For this reason, when the film thickness reduction section 8 is formed in the lower electrode 4, the protrusions 12 formed in the lower electrode and the foreign substances 14 on the lower electrode 4 can be removed.

As a result, it is possible to form a gap between the lower electrode 4 and the upper electrode by the film thickness reduction section 8 and to suppress the lower electrode 4 from coming into contact with or close to the upper electrode. Therefore, a short circuit and a leakage generated between the lower electrode 4 and the upper electrode can be suppressed.

(2) In the laminated body 1 according to the embodiment, the lower electrode 4 is made of metal or metal oxide.

For this reason, the film thickness reduction section 8 can be easily formed in the lower electrode 4 by a known etching method.

Therefore, it is possible to improve the producibility of the laminated body 1. In addition, the manufacturing costs of the laminated body 1 can be reduced.

(3) In the laminated body 1 according to the embodiment, since the substrate 2 has flexibility, it is possible for the laminated body 1 to have a flexible configuration.

In the substrate 2 having flexibility, a short circuit and a leakage are likely to be generated due to the deformation of the substrate in comparison with the case where the substrate is made of a hard material such as glass. However, the protrusion 12 of the lower electrode 4 caused by a protruding object of the substrate 2 or the like can be set as the film thickness reduction section 8 by etching.

As a result, since the contact between the lower electrode 4 and the upper electrode can be suppressed by the film thickness reduction section 8, it is possible to increase the effect of suppressing a short circuit and a leakage generated between the lower electrode 4 and the upper electrode.

(4) In the laminated body 1 according to the embodiment, since the substrate 2 having flexibility is made of plastic, it is possible to obtain the laminated body having flexibility with low costs.

(5) The method of manufacturing a laminated body according to the embodiment includes forming a film thickness reduction section 8 in which the film thickness of the lower electrode 4 in the portion which is not covered by the basic insulating film 6 in the lower electrode 4 is smaller than the film thickness of the lower electrode 4 in the portion which is covered by the basic insulating film 6.

For this reason, when the film thickness reduction section 8 is formed in lower electrode 4, the protrusions 12 formed in the lower electrode and the foreign substances 14 on the lower electrode 4 can be removed.

As a result, since the protrusions and the foreign substances between the lower electrode 4 and the upper electrode are removed, it is possible to suppress the lower electrode 4 from coming into contact with or close to the upper electrode and to suppress a short circuit and a leakage generated between the lower electrode 4 and the upper electrode.

(6) In the method of manufacturing a laminated body according to the embodiment, the film thickness reduction section 8 is formed by etching the basic insulating film 6 as a mask in the forming of the film thickness reduction section.

Due to this, the film thickness reduction section 8 can be easily formed in the lower electrode 4.

As a result, it is possible to improve the producibility of the laminated body 1 and to reduce the manufacturing costs of the laminated body 1.

(7) In the method of manufacturing a laminated body according to the embodiment, one of the lower electrode 4 and the basic insulating film 6 is formed by the wet method.

Therefore, it is possible to reduce the cost of the laminated body 1.

Application Example

Application examples of the embodiment will be enumerated below.

(1) In the laminated body 1 according to the embodiment, the lower electrode 4 is made of metal or metal oxide, but there is no limitation thereto. The lower electrode 4 may be made of materials other than metals and metal oxides.

(2) In the laminated body 1 according to the embodiment, the substrate 2 has flexibility, but there is no limitation thereto. The substrate 2 may not have flexibility.

In this case, for example, a substrate made of glass or quartz may be used and a metal substrate made of stainless steel may be used.

(3) In the laminated body 1 according to the embodiment, the substrate 2 having flexibility is made of plastic, but there is no limitation thereto. The substrate 2 having flexibility may be made of materials other than plastic.

(4) In the method of manufacturing a laminated body according to the embodiment, the film thickness reduction section 8 is formed by etching the basic insulating film 6 as a mask, but there is no limitation thereto. The film thickness reduction section 8 may be formed by methods other than etching the basic insulating film 6 as a mask.

(5) In the method of manufacturing a laminated body according to the embodiment, in the forming of the film thickness reduction section, the film thickness reduction section 8 is formed by etching the basic insulating film 6 as a mask in a state where the entire basic insulating film 6 is formed, but there is no limitation thereto. In other words, in the forming of the film thickness reduction section, the film thickness reduction section 8 may be formed by etching the basic insulating film 6 as a mask in a state where only a part of the basic insulating film 6 is formed.

In this case, the protrusions in the lower electrode 4 and the foreign substances on the lower electrode 4 can be selectively etched.

(6) In the method of manufacturing a laminated body according to the embodiment, at least one of the lower electrode 4 and the basic insulating film 6 is formed by the wet method, but there is no limitation thereto. At least one of the lower electrode 4 and the basic insulating film 6 may be formed by methods other than the wet method.

(7) In the method of manufacturing a laminated body according to the embodiment and the laminated body 1 manufactured by the method, when the upper electrode is formed on the basic insulating film 6, the upper electrode is formed on the laminated insulating film formed on the basic insulating film 6, but there is no limitation thereto. The upper electrode may be directly formed on the basic insulating film 6 without forming the laminated insulating film. Even in this case, a gap can be formed between the lower electrode 4 and the upper electrode by the film thickness reduction section 8. Therefore, in comparison with the case where the lower electrode 4 does not have the film thickness reduction section 8, it is possible to suppress the lower electrode 4 from coming into contact with or close to the upper electrode and to suppress a short circuit and a leakage generated between the lower electrode 4 and the upper electrode.

Second Embodiment

A second embodiment of the invention (hereafter, referred as to "the embodiment") will be described with reference to drawings below.

Configuration

Firstly, with reference to FIGS. 1 to 4B, a configuration of the laminated body 1 according to the embodiment will be described using FIG. 5.

Figure 5:
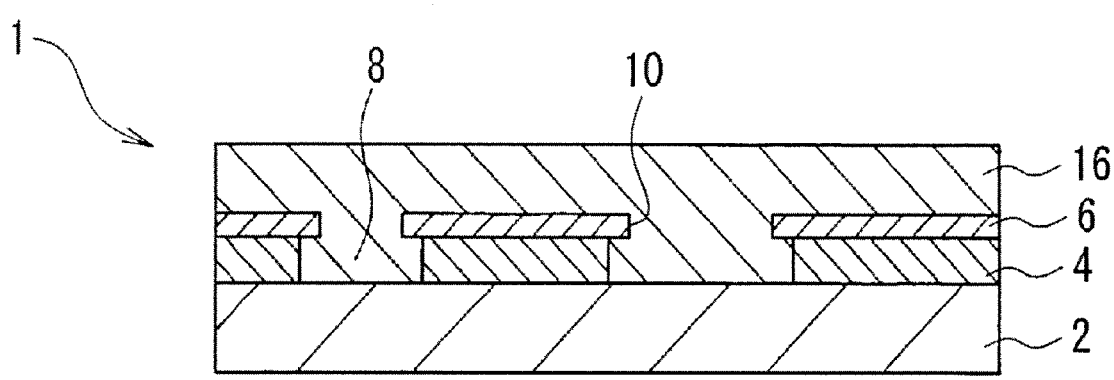
FIG. 5 is a cross-sectional view showing a schematic configuration of a laminated body according to a second embodiment of the invention.

FIG. 5 is a cross-sectional view showing a schematic configuration of the laminated body 1 according to the embodiment.

As shown in FIGS. 1 and 2, the laminated body 1 according to the embodiment includes the substrate 2, a lower electrode 4, the basic insulating film 6, and a laminated insulating film 16.

Since the configuration of the substrate 2, the lower electrode 4 and the basic insulating film 6 is the same as in the above-described first embodiment, the description thereof will be omitted.

The laminated insulating film 16 is formed on the basic insulating film 6 and covers the basic insulating film 6 and the film thickness reduction section 8. Due to this, a surface opposite to the basic insulating film 6 of the laminated insulating film 16 (an upper surface in the FIG. 5) does not have a protrusion portion, which is a uniform plane surface.

Moreover, the laminated insulating film 16 is made of the same material as the basic insulating film 6.

Other configurations thereof are the same as in the above-described first embodiment.

Method of Manufacturing Laminated Body

With reference to FIGS. 1 to 5, the method of manufacturing a laminated body 1 according to the embodiment will be described below.

In the method of manufacturing a laminated body 1 according to the embodiment, after the basic insulating film 6 is formed, the protrusions 12 (refer to FIGS. 3A and 3B) and the foreign substances 14 (refer to FIGS. 4A and 4B) are removed and the laminated insulating film 16 is formed on the basic insulating film 6 after the film thickness reduction section 8 is formed in the lower electrode 4 (refer to FIG. 2).

In the embodiment, a case where a method of forming the laminated insulating film 16 on the basic insulating film 6 is the wet method will be described.

When the laminated insulating film 16 is formed on the basic insulating film 6, the laminated insulating film 16 covers the basic insulating film 6 and the film thickness reduction section 8 and the pin holes 10 opened to the basic insulating film 6.

That is, the method of manufacturing a laminated body according to the embodiment includes forming a laminated insulating film 16 which covers the basic insulating film 6 and the film thickness reduction section 8 on the basic insulating film 6 subsequent to the forming of the film thickness reduction section.

Accordingly, in the method of manufacturing a laminated body 1 according to the embodiment, as in the above-described first embodiment, the pin holes 10 are not formed on the insulating film configured by the basic insulating film 6 and the laminated insulating film 16 and the upper electrode can be formed on the laminated insulating film 16 in a state where the portion which is not covered by the insulating film (the basic insulating film 6 and the laminated insulating film 16) is not present in the lower electrode 4.

Therefore, it is possible to suppress the lower electrode 4 from coming into contact with or close to the upper electrode and to suppress a short circuit and a leakage generated between the lower electrode 4 and the upper electrode.

Other manufacturing processes thereof are the same as in the above-described first embodiment.

Effects of Second Embodiment

The effects of the second embodiment will be enumerated below.

(1) In the laminated body 1 according to the embodiment, the laminated body 1 includes the laminated insulating film 16 which covers the basic insulating film 6 and the film thickness reduction section 8 formed on the basic insulating film 6.

As a result, by laminating the basic insulating film 6 and the laminated insulating film 16, the basic insulating film 6 can be used as a mask at the time of etching the lower electrode 4 or the like so that insulation properties can be improved in the laminated insulating film 16.

(2) In the laminated body 1 according to the embodiment, the basic insulating film 6 is made of the same material as the laminated insulating film 16.

Therefore, after the film thickness reduction section 8 is formed in the lower electrode 4 by etching the basic insulating film 6 as a mask or the like, in the case where the laminated insulating film 16 is laminated, the laminated insulating film 16 can be effectively formed in the film thickness reduction section 8.

(3) In the method of manufacturing a laminated body according to the embodiment, the laminated insulating film 16 is formed by the wet method.

As a result, it is possible to reduce the costs of the laminated body 1.

Application Example

An application example of the embodiment will be described below.

(1) In the laminated body 1 according to the embodiment, the basic insulating film 6 is made of the same material as the laminated insulating film 16, but there is no limitation thereto. The basic insulating film 6 may be made of a different material from the material of the laminated insulating film 16.

Third Embodiment

A third embodiment of the invention (hereafter, referred as to "the embodiment") will be described with reference to drawings below.

Configuration

Firstly, with reference to FIGS. 1 to 5, a configuration of the laminated body 1 according to the embodiment will be described using FIG. 6.

Figure 6:
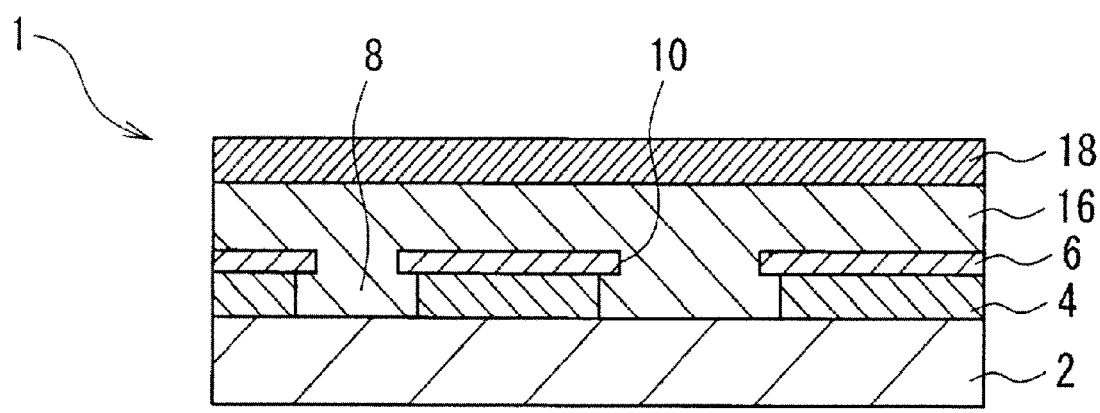
FIG. 6 is a cross-sectional view showing a schematic configuration of a laminated body according to a third embodiment of the invention.

FIG. 6 is s cross-sectional view showing a schematic configuration of the laminated body 1 according to the embodiment.

As shown in FIGS. 1 and 2, the laminated body 1 according to the embodiment includes the substrate 2, the lower electrode 4, the basic insulating film 6, the laminated insulating film 16 and an upper electrode 18.

Since the configuration of the substrate 2, the lower electrode 4, the basic insulating film 6 and the laminated insulating film 16 is the same as the above-described second embodiment, the description thereof will be omitted.

The upper electrode 18 is formed on the laminated insulating film 16 and interposed between the basic insulating film 6 and the laminated insulating film 16 to face the lower electrode 4.

Other configurations thereof are the same as the above-describe second embodiment.

Method of Manufacturing Laminated Body

With reference to FIGS. 1 to 6, the method of manufacturing a laminated body 1 according to the embodiment will be described below.

In the method of manufacturing a laminated body 1 according to the embodiment, the laminated insulating film 16 is formed on the basic insulating film 6 (refer to FIG. 5) and then, the upper electrode 18 is formed on the laminated insulating film 16 to face the lower electrode 4 with interposing of the basic insulating film 6 and the laminated insulating film 16 therebetween.

In other words, the method of manufacturing a laminated body according to the embodiment includes forming a laminated insulating film and forming an upper electrode 18 which faces the lower electrode 4 with interposing of the basic insulating film 6 and the laminated insulating film 16 therebetween on the laminated insulating film 16 subsequent to the forming of the laminated insulating film.

In the embodiment, a case where a method of forming the upper electrode 18 on the laminated insulating film 16 is the wet method will be described.

Here, the laminated insulating film 16 formed on the basic insulating film 6 covers the basic insulating film 6 and the film thickness reduction section 8 and the pin holes 10 formed opened to the basic insulating film 6.

Accordingly, in the method of manufacturing a laminated body 1 according to the embodiment, the pin holes 10 are not formed on an insulating film configured by the basic insulating film 6 and the laminated insulating film 16 and the upper electrode 18 can be formed on the laminated insulating film 16 in a state where a portion which is not covered by the insulating film (the basic insulating film 6 and the laminated insulating film 16) is not present in the lower electrode 4 as in the above-described first embodiment.

Therefore, it is possible to suppress the lower electrode 4 from coming into contact with or close to the upper electrode 18 and to suppress a short circuit and a leakage generated between the lower electrode 4 and the upper electrode 18.

Other manufacturing processes thereof are the same as the above-described second embodiment.

Effects of Third Embodiment

The effects of the third embodiment will be enumerated below.

(1) In the laminated body 1 according to the embodiment, the laminated body 1 includes the upper electrode 18 which is formed on the laminated insulating film 16 and faces the lower electrode 4 with interposing of the basic insulating film 6 and the laminated insulating film 16 therebetween.

As a result, it is possible to form the laminated body capable of suppressing the contact between the lower electrode 4 and the upper electrode 18 and a short circuit and a leakage generated between the lower electrode 4 and the upper electrode 18 by the laminated insulating film 16 formed on the basic insulating film 6.

(2) The method of manufacturing a laminated body according to the embodiment includes forming a laminated insulating film 16 which covers the basic insulating film 6 and the film thickness reduction section 8 on the basic insulating film 6 subsequent to the forming of the film thickness reduction section. Moreover, the method includes forming an upper electrode 18 which faces the lower electrode 4 on the laminated insulating film 16 with interposing of the basic insulating film 6 and the laminated insulating film 8 subsequent to the forming of a laminated insulating film.

As a result, it is possible to form the laminated body capable of suppressing the contact between the lower electrode 4 and the upper electrode 18 and a short circuit and a leakage generated between the lower electrode 4 and the upper electrode 18 by the laminated insulating film 16 formed on the basic insulating film 6.

(3) In the method of manufacturing a laminated body according to the embodiment, the upper electrode 18 is formed by the wet method.

Therefore, it is possible to reduce the costs of the laminated body 1.

Application Example

An application example of the embodiment will be described.

(1) In the method of manufacturing a laminated body according to the embodiment, the upper electrode 18 is formed by the wet method, but there is no limitation thereto. The upper electrode 18 may be formed by methods other than the wet method.

Fourth Embodiment

A fourth embodiment of the invention (hereafter, referred as to "the embodiment") will be described with reference to drawings below.

Configuration

Firstly, with reference to FIGS. 1 to 6, a configuration of a thin film transistor 20 using the laminated body 1 according to the embodiment will be described using FIGS. 7 and 8.

Figure 7:
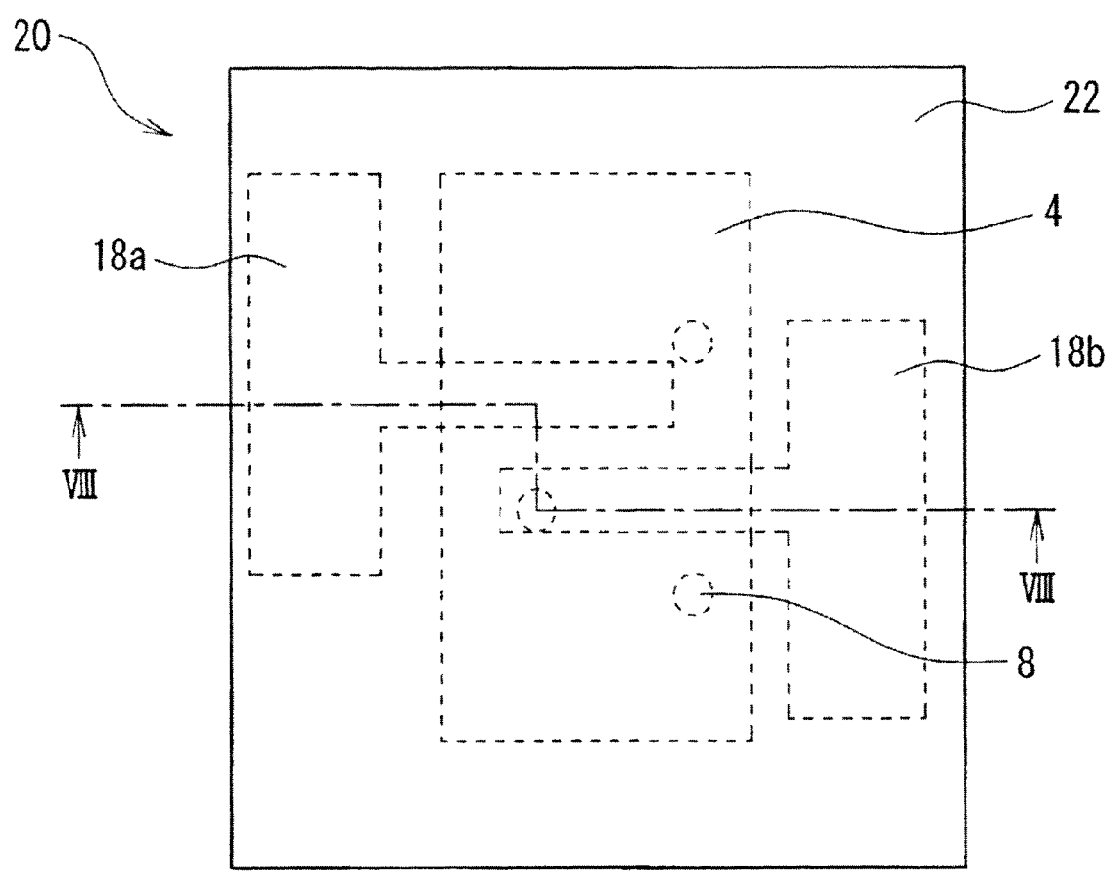
FIG. 7 is a view showing a schematic configuration of a thin film transistor using a laminated body according to a fourth embodiment of the invention.

FIG. 7 is a view showing a schematic configuration of a thin film transistor 20 using the laminated body 1 according to the embodiment. FIG. 8 is a cross-sectional view taken along a line VIII-VIII in FIG. 7.

Figure 8:
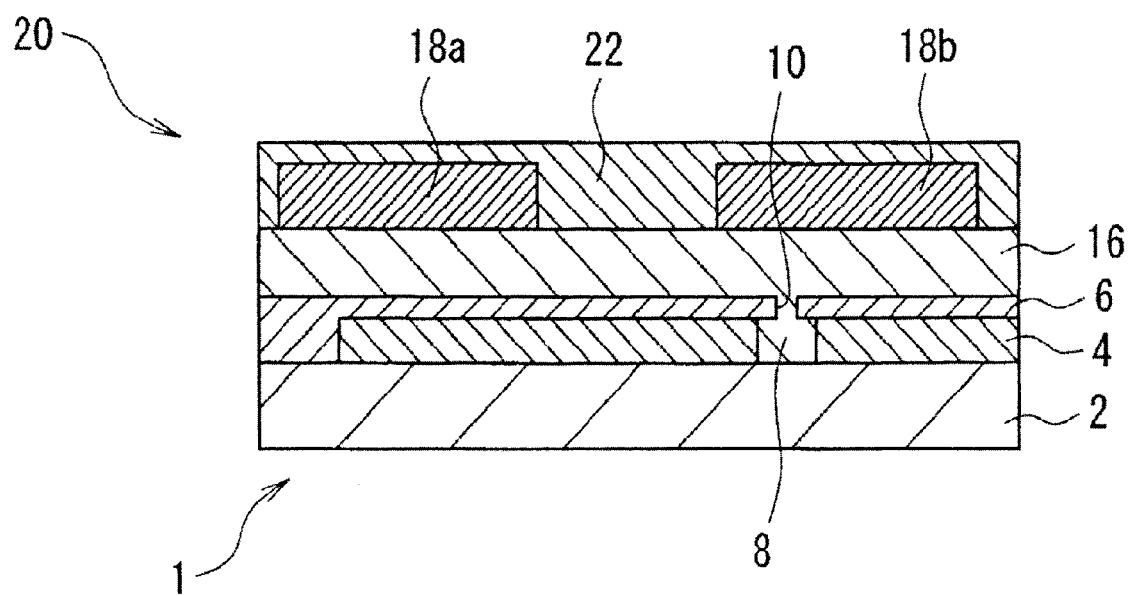
FIG. 8 is a cross-sectional view taken along a line VIII-VIII in FIG. 7.

As shown in FIGS. 7 and 8, the thin film transistor 20 using the laminated body 1 includes the laminated body 1, and a semiconductor layer 22. In other words, the laminated body according to the embodiment is used in the thin film transistor 20.

The laminated body 1 includes the substrate 2, the lower electrode 4, the basic insulating film 6, the laminated insulating film 16 and the upper electrode 18. Since the configuration of the substrate 2, the basic insulating film 6 and the laminated insulating film 16 is the same as in the above-described third embodiment, the description thereof will be omitted.

The lower electrode 4 forms a gate electrode or a capacitor electrode. That is, the laminated body 1 according to the embodiment has a bottom gate structure. Since other configurations of the lower electrode 4 are the same as the above-described third embodiment, the description thereof will be omitted.

The upper electrode 18 is configured with a source electrode 18a and a drain electrode 18b. Since other configurations of the upper electrode 18 are the same as the above-described third embodiment, the description thereof will be omitted.

The semiconductor layer 22 is formed on the laminated insulating film 16 by using the wet method and covers the entire upper electrode 18.

The semiconductor layer 22 is made of an organic semiconductor material. In order to use the flexible substrate 2 having flexibility, it is desirable to use an organic semiconductor material or an oxide semiconductor material as a material of the semiconductor layer 22, and it is preferable to use an organic semiconductor in the case where semiconductor layer 22 is formed by the wet method.

Here, as the organic semiconductor material, a high-molecular organic semiconductor material such as polythiophene, polyallylamine, and a fluorene-bithiophene copolymer and derivatives thereof and a low-molecular organic semiconductor material such as pentacene, tetracene, copper phthalocyanine, and perylene and derivatives thereof can be used.

In addition, as the organic semiconductor material, carbon compounds such as carbon nanotubes and fullerene, a semiconductor nanoparticle dispersion liquid and the like can be also used as the material of the semiconductor layer.

Well-known methods such as gravure printing, offset printing, screen printing, and an inkjet method can be used as the method of printing the organic semiconductor.

Since the above organic semiconductors generally have low solubility with respect to a solvent, flexography printing, reversal offset printing, an inkjet method, and a dispenser which are suitable for a low-viscosity solution are desirably used as the method of forming the semiconductor layer 22 made of the above organic semiconductor material. Particularly, it is most preferable to use the flexography printing since the printing time is short and the used amount of ink is small.

An oxide containing one element or more selected from zinc, indium, tin, tungsten, magnesium, and gallium can be used as the oxide semiconductor material.

Furthermore, well-known materials such as a zinc oxide, an indium oxide, an indium zinc oxide, a tin oxide, a tungsten oxide, and a zinc gallium indium oxide (In—Ga—Zn—O) can be used.

Structures of the oxide semiconductor materials may be any one of a single crystal, a polycrystal, a fine crystal, a mixed crystal of crystalline and amorphous crystal, a nanocrystal-dispersed amorphous, and an amorphous state.

As the method of forming the semiconductor layer 22 made of the oxide semiconductor material, a method in which the film is formed by the sputtering method, a pulse laser deposition method, the vacuum evaporation method, the CVD method, or a sol-gel method, and then the pattern is formed by the photolithographic method or a liftoff method can be used.

Other configurations thereof are the same as the above-described third embodiment.

Effects of Fourth Embodiment

The effects of the fourth embodiment will be enumerated below.

(1) In the laminated body 1 according to the embodiment, the laminated body 1 is used in the thin film transistor 20.

As a result, the thin film transistor 20 in which a short circuit and a leakage generated between the lower electrode 4 and the upper electrode 18 are suppressed and which has high reliability can be obtained.

(2) In the method of manufacturing a laminated body according to the embodiment, the semiconductor layer 22 of the thin film transistor 20 is formed with an organic semiconductor.

As a result, since the entire configuration member of the thin film transistor 20 can be formed by the printing method, it is possible to reduce the costs of the thin film transistor 20.

Application Examples

Application examples of the embodiment will be enumerated below.

Figure 9:
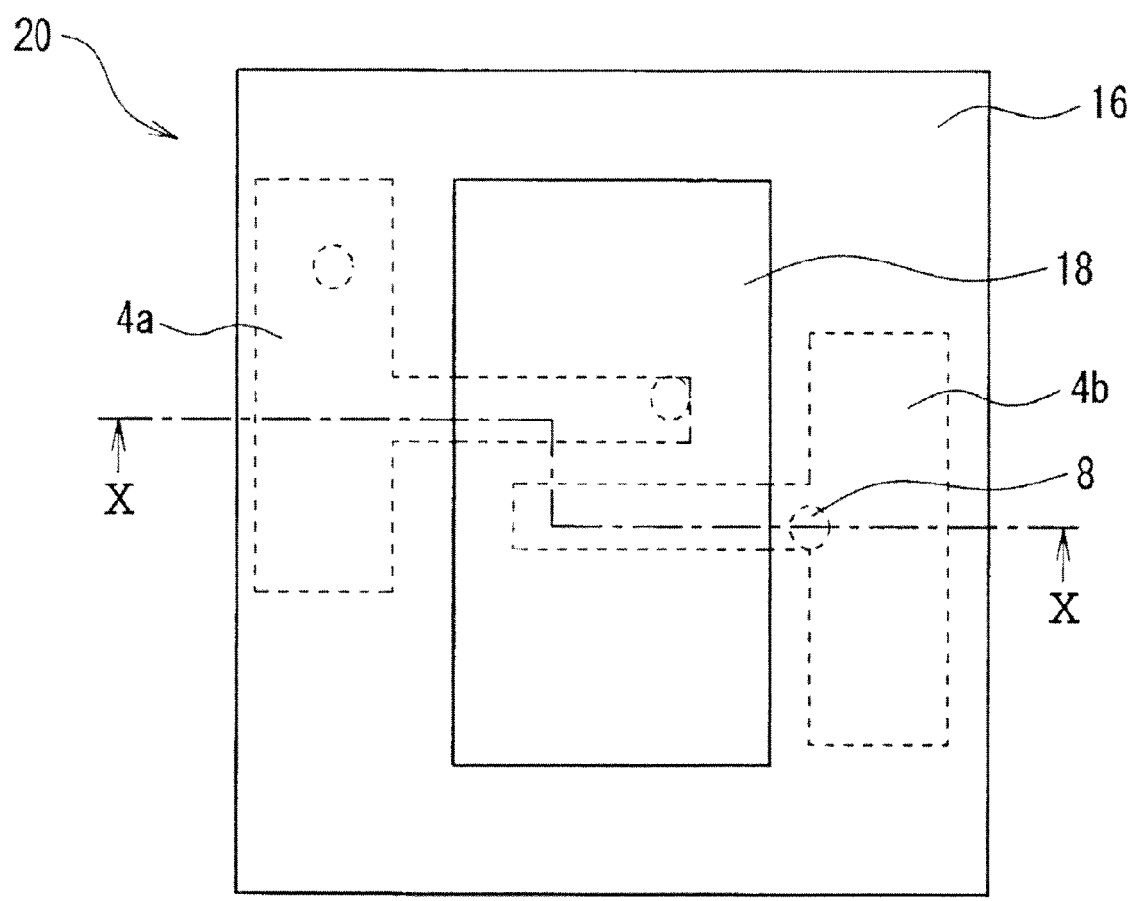
FIG. 9 is a view showing a schematic configuration of a thin film transistor using a laminated body according to a modification of the fourth embodiment of the invention.
Figure 10:
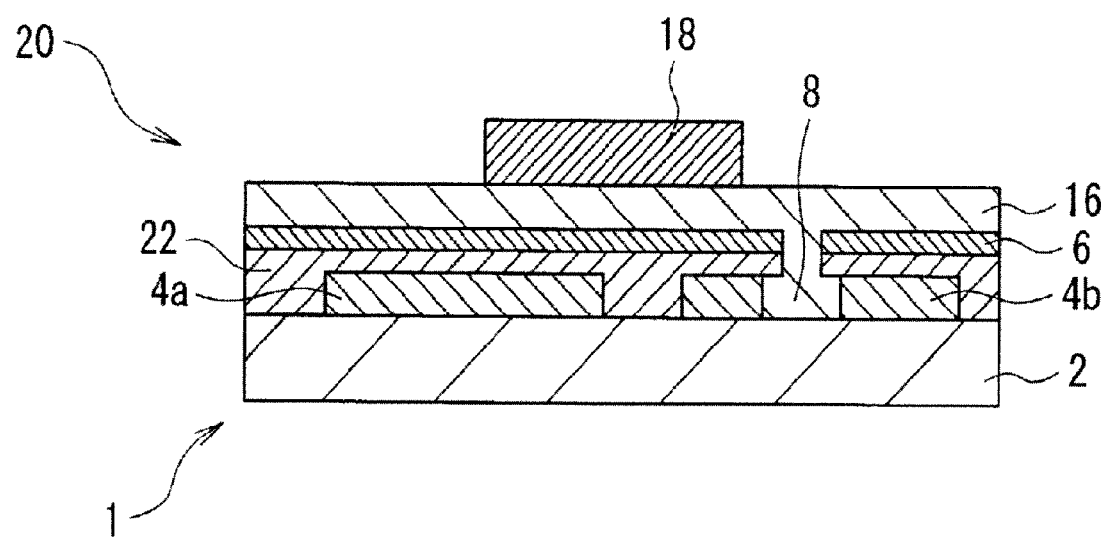
FIG. 10 is a cross-sectional view taken along a line X-X in FIG. 9.

(1) In the method of manufacturing a laminated body according to the embodiment, the lower electrode 4 forms the gate electrode or the capacitor electrode, but there is no limitation thereto. For example, as shown in FIGS. 9 and 10, the lower electrode 4 may form a source electrode 4a and a drain electrode 4b. In other words, the laminated body 1 may have a top gate structure. FIG. 9 is a view showing a schematic configuration of the thin film transistor 20 in which the laminated body 1 according to a modification of the embodiment is used. FIG. 10 is a cross-sectional view taken along a line X-X of FIG. 9.

The laminated body 1 is suitable to have a bottom gate structure or a bottom contact structure not to have influence on the semiconductor layer 22 like etching.

(2) In the method of manufacturing a laminated body according to the embodiment, the laminated body 1 is used in the thin film transistor 20, but there is no limitation thereto. The laminated body 1 may be used in a capacitor or the intersection section between lines.

In this case, when the laminated body 1 is used in a capacitor, the capacitor in which a short circuit and a leakage generated between the lower electrode 4 and the upper electrode are suppressed and which has high reliability can be obtained.

In the same manner, when the laminated body 1 is used in the intersection section between lines, the intersection section between lines in which a short circuit and a leakage generated between the lower electrode 4 and the upper electrode are suppressed and which has high reliability can be obtained.

(3) In the method of manufacturing a laminated body according to the embodiment, the laminated body 1 is used in the thin film transistor 20, but there is no limitation thereto. For example, as shown in FIGS. 11 to 13, the laminated body 1 may be used in a thin film transistor array 24 in which the thin film transistor 20, the capacitor and the intersection section between lines are combined.

Figure 11:
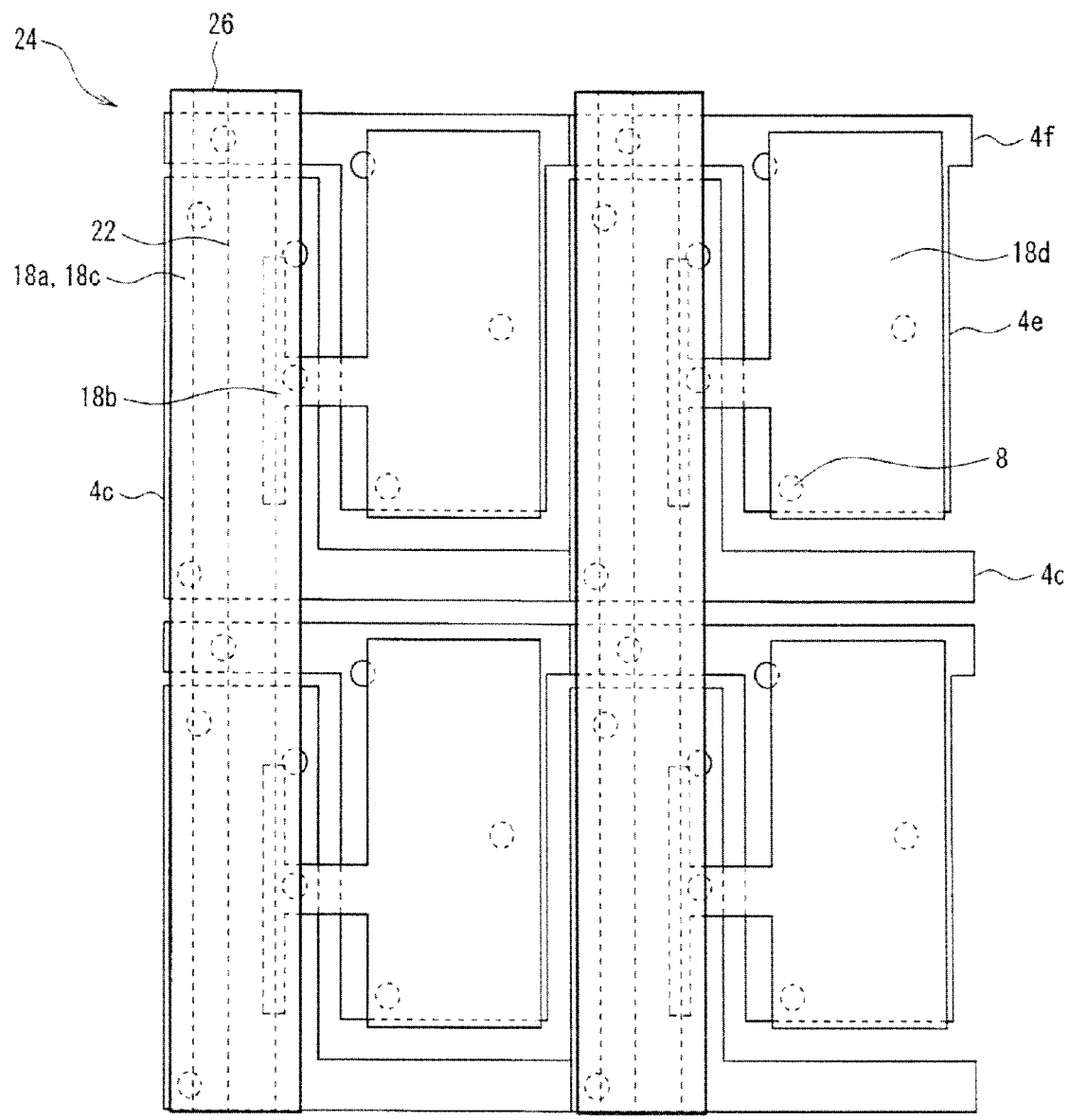
FIG. 11 is a view showing a schematic configuration of a thin film transistor array using the laminated body according to the modification of the fourth embodiment of the invention.

FIG. 11 is a view showing a schematic configuration of the thin film transistor array 24 using the laminated body 1 according to the modification of the embodiment. FIGS. 12A and 12B are schematic views showing one pixel of the thin-film transistor array 24 shown in FIG. 11, FIG. 12A is a view showing only the laminated body 1, and FIG. 12B is a view showing the entire thin film transistor array 24. FIG. 13 is a cross-sectional view taken along a line XIII-XIII in FIG. 12B.

Figure 12:
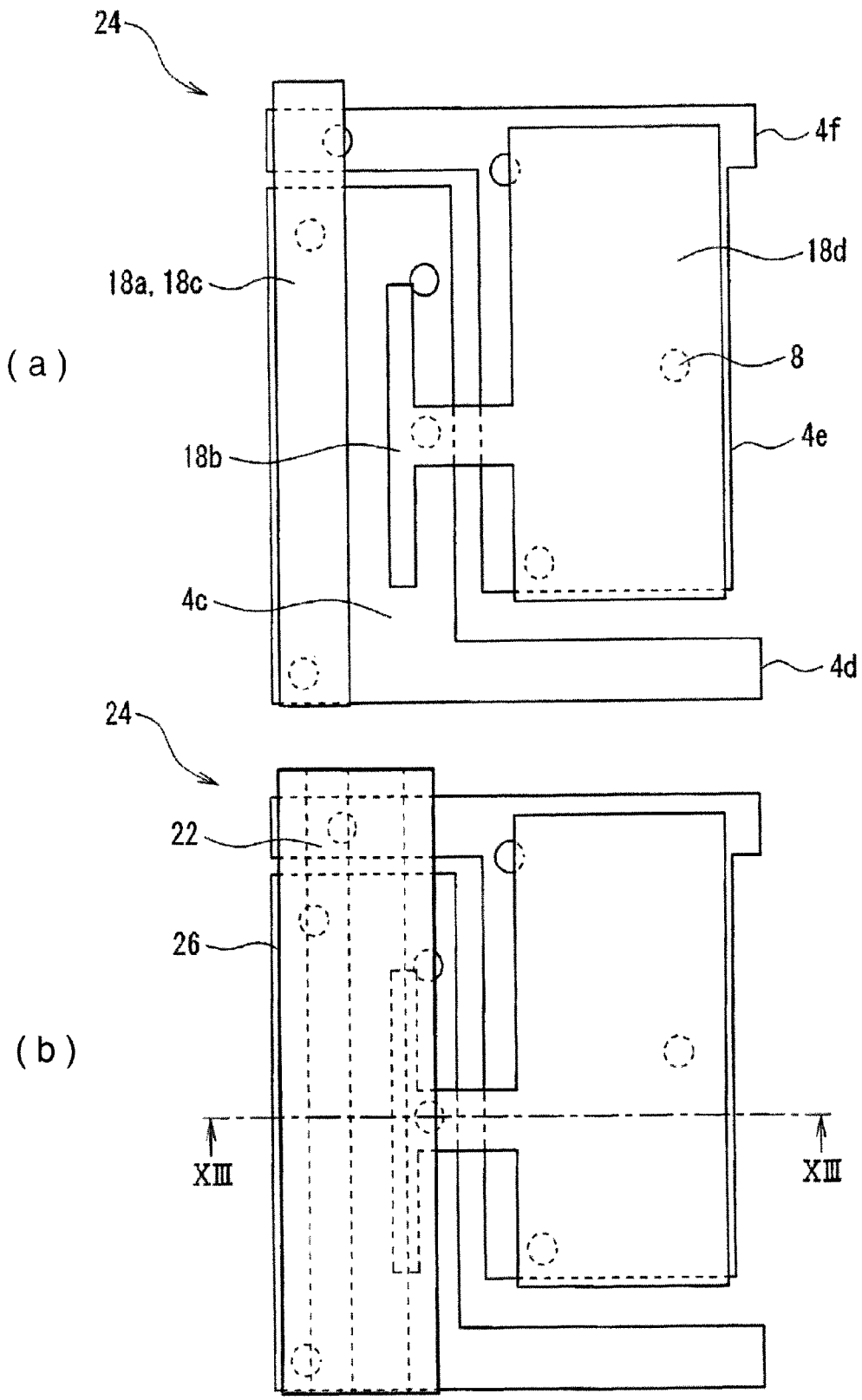
FIGS. 12A and 12B are schematic views showing one pixel of the thin-film transistor array shown in FIG. 11.
Figure 13:
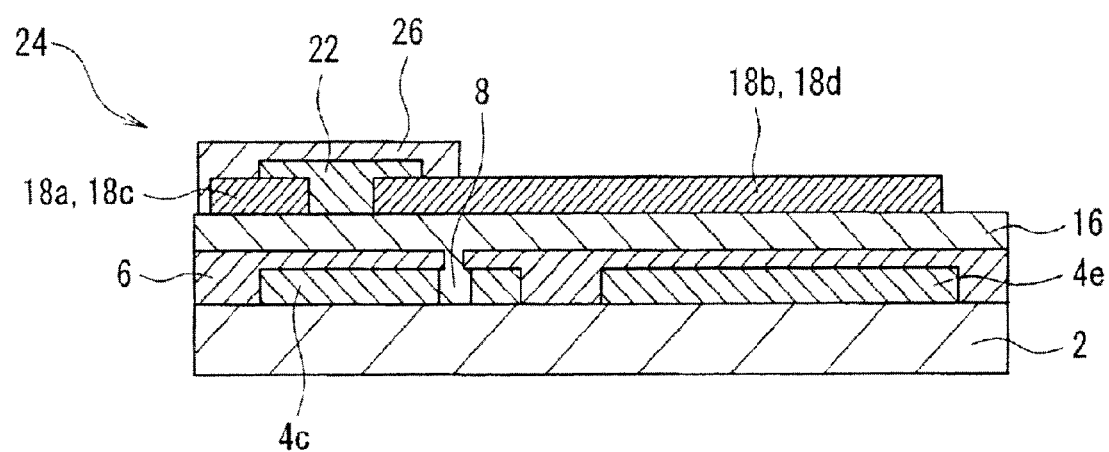
FIG. 13 is a cross-sectional view taken along a line XIII-XIII in FIG. 12B.

In FIGS. 11 to 13, a gate electrode 4c, a gate line 4d, a capacitor electrode 4e, and a capacitor line 4f are respectively shown for the lower electrode 4. Similarly, in FIGS. 11 to 13, a source electrode 18a, a drain electrode 18b, a source line 18c and a pixel electrode 18d are respectively shown for the upper electrode 18.

First Example

With reference to FIGS. 7 and 8, a method of manufacturing the thin film transistor 20 using the laminated body 1 will be described below.

The substrate 2 was made of soda-lime glass.

The lower electrode 4 (gate electrode) was formed on the substrate 2 with the thickness of 50 nm using chromium as a material by an EB deposition method.

The lower electrode 4 was formed by using chromium as a material and performing patterning on the chromium to have a predetermined shape through a photolithography method.

The basic insulating film 6 was formed with the thickness of 100 nm by the spin coat method using polyvinyl phenol (manufactured by Sigma-Aldrich Co. LLC.) as a material.

As an etching solution, a solution mixed at a ratio of "cerium ammonium nitrate:perchloric acid:water=34:16:

150" was used, and the substrate 2 in which the lower electrode 4 and the basic insulating film 6 were formed was dipped into the solution for 15 minutes to form the film thickness reduction section 8.

The position or size of the film thickness reduction section 8 shown in FIGS. 7 and 8 is schematically drawn and the actual position or size is different.

The laminated insulating film 16 was formed with the thickness of 500 nm by the spin coat method using polyvinyl phenol (manufactured by Sigma-Aldrich Co. LLC.) as a material.

The laminated insulating film was subjected to printing with the nano silver ink (Nano Silver manufactured by Sumitomo Electric Industries, Ltd.: polyethylene glycol #200 manufactured by Sigma-Aldrich Co. LLC.=8:1 (ratio by mass)) as a material by the reversal offset printing method, and baked at 180° C. for 1 hour to form the upper electrode 18 (the source electrode 18a and the drain electrode 18b).

A solution, in which Lisicon SP200 (manufactured by Merck) was dissolved in tetralin (manufactured by Kanto Chemical Co., Inc.) so as to become 1.0% by mass, was used as a material to form the semiconductor layer 22 by the spin coat method.

As a result of manufacturing the thin film transistor 20 using the above material and manufacturing method, it was possible to manufacture the thin film transistor 20 in which a short circuit and a leakage were not generated between the lower electrode 4 and the upper electrode 18.

Second Example

With reference to FIGS. 7 and 8, the method of manufacturing the thin film transistor 20 using the laminated body 1 will be described below.

A polyethylene naphthalate (PEN) film (manufactured by Teijin DuPont Films Japan Ltd.) was used as a material to form the substrate 2.

The lower electrode 4 (gate electrode) was formed with the thickness of 50 nm by the EB deposition method by using aluminum as a material and performing patterning on the aluminum to have a predetermined shape through the photolithography method.

The basic insulating film 6 was formed with the thickness of 100 nm by the spin coat method using polyimide (Neopulim, manufactured by Mitsubishi Gas Chemical Co., Inc.) as a material.

As an etching solution, a solution mixed at a ratio of "phosphoric acid:nitric acid:acetic acid:water=85:5:5:5" was used, and the substrate 2 in which the lower electrode 4 and the basic insulating film 6 were formed was dipped into the solution for 60 minutes to form the film thickness reduction section 8.

The position or size of the film thickness reduction section 8 shown in FIGS. 7 and 8 is schematically drawn and the actual position or size is different similar to the above-described first example.

The laminated insulating film 16 was formed with the thickness of 500 nm by the spin coat method using polyvinyl phenol (manufactured by Sigma-Aldrich Co. LLC.) as a material.

The laminated insulating film was subjected to printing with the nano silver ink (Nano Silver manufactured by Sumitomo Electric Industries, Ltd.: polyethylene glycol #200 manufactured by Sigma-Aldrich Co. LLC.=8:1 (ratio by mass)) as a material by the reversal offset printing method, and baked at 180° C. for 1 hour to form the upper electrode 18 (the source electrode 18a and the drain electrode 18b).

A solution, in which Lisicon SP200 (manufactured by Merck) was dissolved in tetralin (manufactured by Kanto Chemical Co., Inc.) so as to become 1.0% by mass, was used as a material to form the semiconductor layer 22 by the spin coat method.

As a result of manufacturing the thin film transistor 20 using the above material and manufacturing method, it was possible to manufacture the thin film transistor 20 in which a short circuit and a leakage were not generated between the lower electrode 4 and the upper electrode 18 as in the first example.

Third Example

With reference to FIGS. 11 and 13, an example of a method of manufacturing the thin film transistor array 24 using the laminated body 1 will be described below.

The polyethylene naphthalate (PEN) film (manufactured by Teijin Du Pont Films Japan Ltd.) was used as a material to form the substrate 2.

The laminated insulating film was subjected to printing with the nano silver ink (Nano Silver manufactured by Sumitomo Electric Industries, Ltd.: polyethylene glycol #200 manufactured by Sigma-Aldrich Co. LLC.=8:1 (ratio by mass)) as a material by the reversal offset printing method, and baked at 180° C. for 1 hour to form the lower electrode 4 (the gate electrode 4c, the gate line 4d, the capacitor electrode 4e and the capacitor line 4f).

The basic insulating film 6 was formed with the thickness of 100 nm by the spin coat method using polyvinyl phenol (manufactured by Sigma-Aldrich Co. LLC.) as a material.

As an etching solution, a solution mixed at a ratio of "phosphoric acid:nitric acid:acetic acid:water=85:5:5:5" was used, and the substrate 2 in which the lower electrode 4 and the basic insulating film 6 were formed was dipped into the solution for 60 minutes to form the film thickness reduction section 8.

The position or size of the film thickness reduction section 8 shown in FIGS. 11 to 13 is schematically drawn and the actual position or size is different similar to the above-described first example.

The laminated insulating film 16 was formed with the thickness of 500 nm by the spin coat method using polyvinyl phenol (manufactured by Sigma-Aldrich Co. LLC.) as a material.

The laminated insulating film was subjected to printing with the nano silver ink (Nano Silver manufactured by Sumitomo Electric Industries, Ltd.: polyethylene glycol #200 manufactured by Sigma-Aldrich Co. LLC.=8:1 (ratio by mass)) as a material by the reversal offset printing method, and baked at 180° C. for 1 hour to form the upper electrode 18 (the source electrode 18a, the drain electrode 18b, the source line 18c and the pixel electrode 18d).

A solution, in which Lisicon SP200 (manufactured by Merck) was dissolved in tetralin (manufactured by Kanto Chemical Co., Inc.) so as to become 1.0% by mass, was used as a material and the laminated insulating film was subjected to printing with a semiconductor pattern by the flexography printing and dried at 100° C. for 60 minutes to form the semiconductor layer 22.

CYTOP (manufactured by ASAHI GLASS CO., LTD) was used as a material, a sealing pattern was printed by the flexography printing and dried at 100° C. for 90 minutes to form a sealing layer 26.

As a result of manufacturing the thin film transistor array 24 using the above material and manufacturing method, it was possible to manufacture the thin film transistor array 24 in which a short circuit and a leakage were not generated between the lower electrode 4 and the upper electrode 18.

Comparative Example

Figure 14:
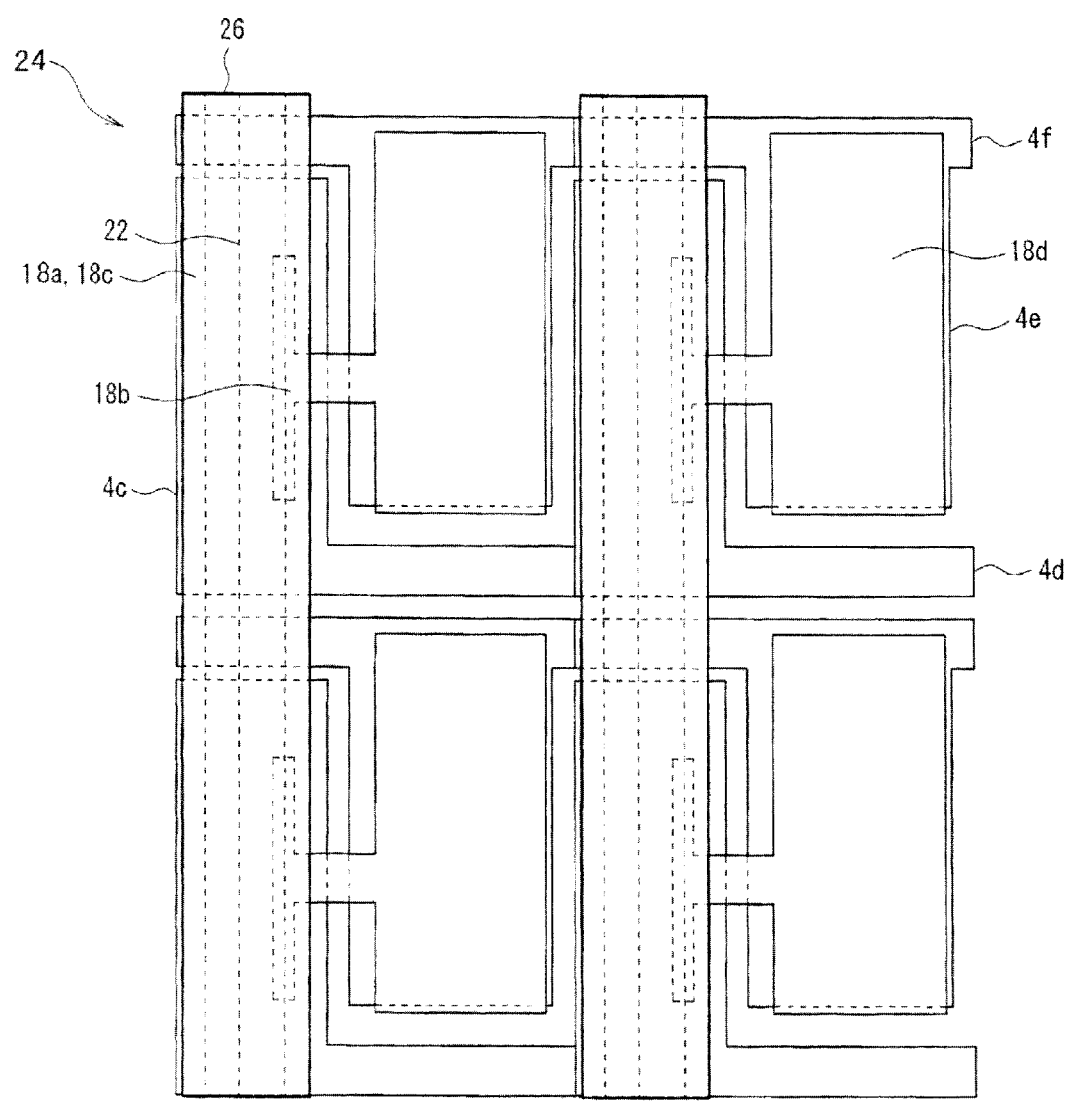
FIG. 14 is a view showing a schematic configuration of a thin film transistor array using a laminated body according to a comparative example.

A comparative example of the thin film transistor array 24 using the laminated body 1 will be described using FIG. 14. FIG. 14 is a view showing a schematic configuration of the thin film transistor array 24 using the laminated body 1 according to the comparative example.

In the comparative example, the thin film transistor array 24 was manufactured by using the same material and manufacturing method as the above-described third example except that the film thickness reduction section 8 was not formed in the lower electrode 4 (the gate electrode 4c, the gate line 4d, the capacitor electrode 4e and the capacitor line 4f) as shown in FIG. 14.

As a result of manufacturing the thin film transistor array 24 without forming the film thickness reduction section 8 on the lower electrode 4 using the same material and the manufacturing method as the above-described third example, a portion where a short circuit was generated between the lower electrode 4 and the upper electrode 18 was present.

Comparison of Each Example and Comparative Example

Accordingly, it was confirmed that in the thin film transistor 20 according to the above-described first and second examples and the thin film transistor array 24 according to the third example, since the film thickness reduction section 8 was formed in the lower electrode 4, a short circuit and a leakage were not generated between the lower electrode 4 and the upper electrode 18. Meanwhile, it was confirmed that in the thin film transistor array 24 according to the comparative example, since the film thickness reduction section 8 was not formed in the lower electrode 4, a short circuit was generated between the lower electrode 4 and the upper electrode 18.

In other words, it was confirmed that the thin film transistor 20 and the thin film transistor array 24 in which a short circuit and a leakage were not generated between the lower electrode 4 and the upper electrode 18 could be manufactured by using the laminated body 1 according to the invention.

What is claimed is:

1. A method of manufacturing a laminated body which forms a basic insulating film that covers a lower electrode formed on a substrate, the method comprising:
    forming a film thickness reduction section in which a film thickness of a portion of the lower electrode not covered by the basic insulating film is less than a film thickness of a portion of the lower electrode covered by the basic insulating film, further comprising:
    forming a laminated insulating film on the basic insulating film subsequent to the forming of the film thickness reduction section, wherein the laminated insulating film covers the basic insulating film and the film thickness reduction section; and
    forming an upper electrode on the laminated insulating film subsequent to the forming of the laminated insulating film, wherein the upper electrode faces the lower electrode, and the basic insulating film and the laminated insulating film are disposed between the upper electrode and lower electrode.

2. The method of manufacturing a laminated body according to claim 1,
    wherein at least one of the laminated insulating film and the upper electrode is formed by a wet method.

3. The method of manufacturing a laminated body according to claim 1, wherein the forming of the film thickness reduction section includes etching the basic insulating film as a mask.

4. The method of manufacturing a laminated body according to claim 3, wherein the film thickness reduction section is formed by etching the basic insulating film in a state in which at least a part of the basic insulating film has been formed on the lower electrode.

5. The method of manufacturing a laminated body according to claim 1, wherein at least one of the lower electrode and the basic insulating film is formed by a wet method.

* * * * *